(12) United States Patent
Herron et al.

(10) Patent No.: US 8,470,208 B2
(45) Date of Patent: Jun. 25, 2013

(54) ORGANOMETALLIC COMPLEXES

(75) Inventors: Norman Herron, Newark, DE (US);
Steven W. Shuey, Landenberg, PA (US);
Jeffrey A. Merlo, Wilmington, DE (US)

(73) Assignee: E I du Pont de Nemours and Company, Wilmington, DE (US)

( * ) Notice: Subject to any disclaimer, the term of this patent is extended or adjusted under 35 U.S.C. 154(b) by 1445 days.

(21) Appl. No.: 11/654,773

(22) Filed: Jan. 18, 2007

(65) Prior Publication Data

US 2010/0264380 A1 Oct. 21, 2010

Related U.S. Application Data

(60) Provisional application No. 60/761,524, filed on Jan. 24, 2006.

(51) Int. Cl.
*H01B 1/12* (2006.01)
*H01L 29/08* (2006.01)
*H01J 1/62* (2006.01)
*C09K 11/06* (2006.01)
*C07D 215/30* (2006.01)

(52) U.S. Cl.
USPC ..... 252/519.2; 257/40; 313/483; 252/301.16; 546/7

(58) Field of Classification Search
USPC ..... 252/500, 519.2, 301.16; 257/40; 313/483; 546/7
See application file for complete search history.

(56) References Cited

U.S. PATENT DOCUMENTS 5,294,870 A * 3/1994 Tang et al. ............... 313/504
5,552,678 A 9/1996 Tang ........................ 315/169.3

(Continued)

FOREIGN PATENT DOCUMENTS

EP 0 525 904 A1 2/1993
EP 0 534 510 A1 3/1993

(Continued)

OTHER PUBLICATIONS

I. H. Campbell et al, Excitation Transfer Processes in a Phosphor-Doped Poly(P-Phenylene Vinylene) Light-Emitting Diode, Physical Review B, vol. 65:085210-1-085210-8, 2002.

(Continued)

*Primary Examiner* — Mark Kopec
*Assistant Examiner* — Jaison Thomas

(57) ABSTRACT

The present disclosure relates to organometallic complexes and electronic devices containing the complexes. The complexes have the formula $MY_nZ$, where n is 1, 2, or 3; M is a metal in a +2, +3, or +4 oxidation state, Y is selected from an 8-hydroxyquinolate and a substituted 8-hydroxyquinolate, and Z is a phenolate. At least one Y is a substituted 8-hydroxyquinolate having the formula

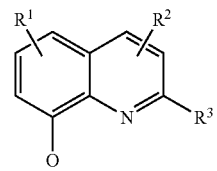

where:

$R^1$ and $R^2$ are the same or different at each occurrence and each represents one or more of a substituent selected from the group consisting of H, alkyl, fluoroalkyl, aryl, fluoroaryl, alkylaryl, alkoxy, aryloxy, fluoroalkoxy, fluoroaryloxy, heteroalkyl, fluoroheteroalkyl, heteroaryl, fluoroheteroaryl, heteroalkylaryl, heteroalkoxy, heteroaryloxy, fluoroheteroalkoxy, fluoroheteroaryloxy, a solvent-solubilizing group, and a Tg enhancing group, wherein at least one of $R^1$ and $R^2$ is a solvent-solubilizing or Tg enhancing group; and $R^3$ is selected from the group consisting of H, an alkyl group, and a substituted alkyl group.

21 Claims, 9 Drawing Sheets

U.S. PATENT DOCUMENTS

| | | | |
|---|---|---|---|
| 5,942,648 | A | 8/1999 | Coates et al. |
| 6,245,449 | B1 * | 6/2001 | Tamano et al. ............... 428/690 |
| 6,303,238 | B1 | 10/2001 | Thompson et al. |
| 6,670,645 | B2 | 12/2003 | Grushin ............................ 257/98 |
| 6,894,129 | B2 | 5/2005 | Lee et al. |
| 2001/0019782 | A1 | 9/2001 | Igarashi et al. |
| 2004/0127637 | A1 | 7/2004 | Hsu et al. |
| 2004/0188673 | A1 | 9/2004 | Grushin et al. |
| 2004/0214034 | A1 | 10/2004 | Utsugi et al. |
| 2004/0254297 | A1 | 12/2004 | Hsu et al. |
| 2005/0170206 | A1 * | 8/2005 | Ma et al. ....................... 428/690 |
| 2006/0040139 | A1 | 2/2006 | Herron et al. |
| 2007/0054148 | A1 | 3/2007 | Matsuo et al. |
| 2007/0212569 | A1 * | 9/2007 | Je et al. .......................... 428/690 |
| 2009/0216018 | A1 * | 8/2009 | Herron et al. .................... 546/7 |

FOREIGN PATENT DOCUMENTS

| | | | |
|---|---|---|---|
| EP | 992564 | A1 | 4/2000 |
| EP | 1 013 740 | A2 | 6/2000 |
| EP | 1191612 | A2 | 3/2002 |
| EP | 1191614 | A2 | 3/2002 |
| JP | 05198378 | A | 8/1993 |
| JP | 05214332 | A | 8/1993 |
| JP | 07048385 | A | 2/1995 |
| JP | 09031454 | A | 2/1997 |
| JP | 11040355 | A | 2/1999 |
| JP | 11067449 | A | 3/1999 |
| JP | 11121179 | A | 4/1999 |
| JP | 2001143869 | A | 5/2001 |
| JP | 2002313580 | A | 10/2002 |
| JP | 2004-359671 | * | 12/2004 |
| JP | 2004 359671 | A | 12/2004 |
| JP | 2004536124 | T | 12/2004 |
| JP | 2005082645 | A | 3/2005 |
| JP | 2006510926 | T | 9/2005 |
| WO | 00/70655 | A2 | 11/2000 |
| WO | 0141512 | A1 | 6/2001 |
| WO | 02/02714 | A2 | 1/2002 |
| WO | 02/15645 | A1 | 2/2002 |
| WO | 2004028217 | A1 | 4/2004 |
| WO | WO 2005/014551 | | 2/2005 |
| WO | 2005089025 | A1 | 9/2005 |
| WO | 2006033831 | A1 | 3/2006 |

OTHER PUBLICATIONS

D. F. O'Brien et al, Electrophoresence From a Doped Polymer Light Emitting Diode, Synthetic Metals, vol. 116:379-383, 2001.

G. Gustafsson et al., Flexible Light-Emitting Diodes Made From Soluble Conducting Polymers, Nature, vol. 357:477-479, 1992.

Takakazu Yamamoto, Electrically Conducting and Thermally Stable n-Conjugated Poly (Arylene)S Prepared by Organometallic Processes, Prog. Polym. Sci., vol. 17:1153-1205, 1992.

Chen, C. H. et al: "Fluorescent dopants in organic electroluminescent devices", Proceedings of SPIE-The International Society for Optical Engineering, 1998, 3421 (Display Technologies II), 78-82.

Chai S Y et al: "5-coordinated aluminum complexes having two 2,4-dimethyl-8-hydroxylqu inoline ligands and a phenolic ligand as possible materials for white emission organic light-emitting devices" Thin Solid Films, Elsevier-Sequoia S.A. Lausanne, CH; vol. 479, No. 1-2, May 23, 2005, pp. 282-287.

International Search Report, US Commissioner for Patents, Alexandria, Virginia, in PCT/US2007/01372, PCT Counterpart of the Present U.S. Appl. No. 11/654,773, Lee W Young, Authorized Officer, Sep. 12, 2007.

Supplementary European Search Report, European Patent Office, Munich Germany, in 07716778.1, European Counterpart of the Present U.S. Appl. No. 11/654,773, Csaba A Nemes, Authorized Officer, Feb. 11, 2011.

Kirk-Othmer Encyclopedia of Chemical Technology, Fourth Edition, vol. 18, pp. 837-860, 1996 Y. Wang.

Abdul-Rahman, Azilah et al., "Dinuclear molybdenum compleses derived from diphenols: electrochemical interactions and reduced species," Polyhedron, 1997, vol. 16, No. 24, pp. 4353-4362.

Bradley et al., "Electrophosphoresence from a Doped Polymer Light Emitting Diode," Synthetic Metals 2001, 116 (1-3), pp. 379-383.

Chebaane et al., No. 473: Synthese d'Aryl-2 Naphtalenes et de Dibenzocoumarines. 2e Partie: Aromatisation par le Palladium/ Charbon des Tetrahydrodibenzocoumarines: Synthese d'Aryl-2-naphtalenes et de dibenzocoumarines, Bulletin de la Societe Chimique de France, Nov.-Dec. 1975, pp. 2521-2526.

Extended European Search Report for Application No. EP 05855983. 2; European counterpart to U.S. Appl. No. 11/722,129; European Patent Office, Munich, Germany; Csaba Nemes, Examiner; Sep. 6, 2010.

PCT International Search Report for Application No. PCT/US2005/ 047501; PCT counterpart of U.S. Appl. No. 11/722,129; Porfirio Nazario-Gonzalez, Authorized Officer; Jul. 26, 2006.

* cited by examiner

ORGANOMETALLIC COMPLEXES

CROSS REFERENCE TO RELATED APPLICATION

This application claims the benefit of priority under 35 U.S.C. §119(e) from U.S. Provisional Application No. 60/761,524, filed Jan. 24, 2006, which is incorporated by reference herein as if fully set forth.

BACKGROUND INFORMATION

1. Field of the Disclosure

This disclosure relates in general to organic electronic devices and materials and methods for the fabrication of same.

2. Description of the Related Art

Organic electronic devices define a category of products that include an organic active layer. Such devices convert electrical energy into radiation, detect signals through electronic processes, convert radiation into electrical energy, or include one or more organic semiconductor layers. Organic light-emitting diodes (OLEDs) are an organic electronic device comprising an organic layer capable of electroluminescence. In some OLEDs, the active organic layers may comprise simple organic molecules, conjugated polymers, or organometallic complexes. Such active organic layers can be sandwiched between electrical contact layers. When a voltage is applied across these electrical contact layers, an emissive organic layer emits light. The emission of light from the photoactive organic layers in OLEDs may be used, for example, in electrical displays and microelectronic devices. In many instances, a preferred low-cost and scalable method of device manufacture involves deposition of the various organic layer materials from liquids using spin-coating, ink-jetting, and other techniques. Such deposition is followed by drying to remove any solvents. These process steps may result in phase segregation and/or crystallization of materials.

Thus, it remains desirable to discover active materials that may be suitable for various deposition techniques to make organic electronic devices.

SUMMARY

Provided are organometallic complexes having the formula:

$$MY_nZ$$

where:
  n is 1, 2, or 3;
  M is a metal in a +2, +3, or +4 oxidation state;
  Y is the same or different at each occurrence and is selected from the group consisting of 8-hydroxyquinolate and a substituted 8-hydroxyquinolate; and
  Z is a phenolate;
wherein at least one Y is a substituted 8-hydroxyquinolate having the formula

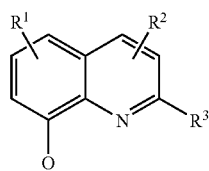

where:
  $R^1$ and $R^2$ are the same or different at each occurrence and each represents one or more of a substituent selected from the group consisting of H, alkyl, fluoroalkyl, aryl, fluoroaryl, alkylaryl, alkoxy, aryloxy, fluoroalkoxy, fluoroaryloxy, heteroalkyl, fluoroheteroalkyl, heteroaryl, fluoroheteroaryl, heteroalkylaryl, heteroalkoxy, heteroaryloxy, fluoroheteroalkoxy, fluoroheteroaryloxy, cyano, dialkylamine, diarylamine, halide, a solvent-solubilizing group, and a Tg enhancing group, wherein at least one of $R^1$ and $R^2$ is a solvent-solubilizing or Tg enhancing group; and
  $R^3$ is selected from the group consisting of H, an alkyl group, and a substituted alkyl group.

There is also provided an electronic device comprising at least one active layer comprising at least one complex, as described above.

There is also provided an electronic device comprising a photoactive layer and a cathode, and further comprising the above complex, wherein the complex is in a layer selected from the group consisting of the photoactive layer and a layer between the photoactive layer and the cathode.

The foregoing general description and the following detailed description are exemplary and explanatory only and are not restrictive of the invention, as defined in the appended claims.

BRIEF DESCRIPTION OF THE DRAWINGS

Embodiments are illustrated in the accompanying figures to improve understanding of concepts as presented herein.

Figure 1:
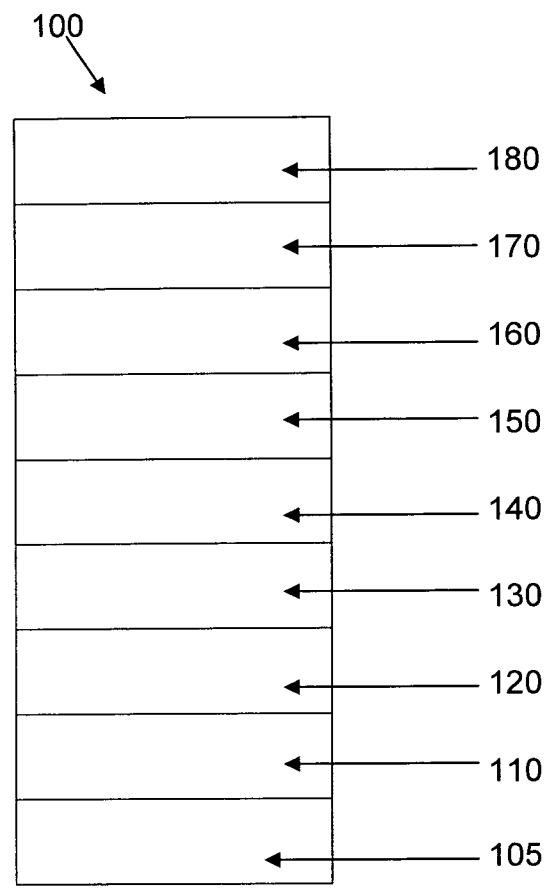
FIG. 1 includes a schematic diagram of one illustration of an organic electronic device, an example of an organic light-emitting diode.

The figure(s) are provided by way of example and are not intended to limit the invention. Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

DETAILED DESCRIPTION

In one embodiment, organometallic complexes are provided. The complexes have the formula:

$$MY_nZ$$

where:
  n is 1, 2, or 3;
  M is a metal in a +2, +3, or +4 oxidation state;
  Y is the same or different at each occurrence and is selected from the group consisting of 8-hydroxyquinolate and a substituted 8-hydroxyquinolate; and Z is a phenolate;
wherein at least one Y is a substituted 8-hydroxyquinolate having the formula

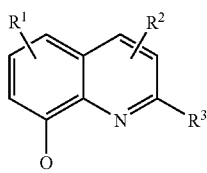

where:
R$^1$ and R$^2$ are the same or different at each occurrence and each represents one or more of a substituent selected from the group consisting of H, alkyl, fluoroalkyl, aryl, fluoroaryl, alkylaryl, alkoxy, aryloxy, fluoroalkoxy, fluoroaryloxy, heteroalkyl, fluoroheteroalkyl, heteroaryl, fluoroheteroaryl, heteroalkylaryl, heteroalkoxy, heteroaryloxy, fluoroheteroalkoxy, fluoroheteroaryloxy, cyano, dialkylamine, diarylamine, halide, a solvent-solubilizing group, and a Tg enhancing group, wherein at least one of R$^1$ and R$^2$ is a solvent-solubilizing or Tg enhancing group; and
R$^3$ is selected from the group consisting of H, an alkyl group, and a substituted alkyl group.

In one embodiment, M is a metal selected from the group consisting of Al, Zn, Zr, In, and Ga. In one embodiment, M is Al.

In another embodiment, at least one of R$^1$ and R$^2$ is an alkyl group. In one aspect, the alkyl group has 1-6 carbons.

In another embodiment, at least one of R$^1$ and R$^2$ is an alkylaryl group. In one aspect, the alkyl group has 1-6 carbons In another embodiment, Z is a phenolate having formula I or II:

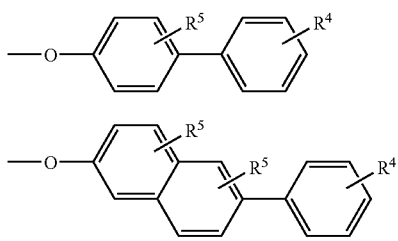

wherein R$^4$ and R$^5$ are independently selected and each is one or more of a substituent selected from the group consisting of H, alkyl, substituted alkyl, aryl, substituted aryl, F, CN, a solvent-solubilizing group, and a Tg enhancing group.

In another embodiment, R$^4$ is an alkyl group having 1-6 carbon atoms.

In one embodiment, there is provided a composition comprising at least one of the above described complexes.

In another embodiment, the composition further comprises a solvent. In another embodiment, the solvent is selected from the group consisting of, benzene, alkyl substituted benzene, fluoroalkyl substituted benzene, alkoxy substituted benzene, halo substituted benzene, haloalkanes, alkyl or aryl esters, alkyl or aryl ketones and the like. (esp toluene, trifluorotoluene, chlorobenzene, anisole, ethylacetate, cyclopentanone.)

In another embodiment, the composition further comprises a photoactive material. In another embodiment, the photoactive material comprises an organometallic complex.

In another embodiment, the composition further comprises a charge transport material. In another embodiment, the charge transport material is selected from the group consisting of triarylamines, triarylmethanes, N-substituted carbazoles and the like.

In one embodiment, there is provided an electronic device comprising an active layer comprising at least one of the above described complexes.

In another embodiment, the active layer may be a photoactive layer and/or a charge transport layer.

In one embodiment, the active layer is an electron transport layer.

In one embodiment, the active layer is a hole-blocking layer.

In one embodiment, the active layer may comprise more than one of the above described complexes.

In one embodiment, there is provided an electronic device comprising a photoactive layer and a cathode, and further comprising the above complex, wherein the complex is in a layer selected from the group consisting of the photoactive layer and a layer between the photoactive layer and the cathode.

Many aspects and embodiments have been described above and are merely exemplary and not limiting. After reading this specification, skilled artisans appreciate that other aspects and embodiments are possible without departing from the scope of the invention.

Other features and benefits of any one or more of the embodiments will be apparent from the following detailed description, and from the claims. The detailed description first addresses Definitions and Clarification of Terms, followed by the Organometallic Complex, the Composition, the Device, and finally Examples.

1. Definitions and Clarification of Terms

Before addressing details of embodiments described below, some terms are defined or clarified.

The term "active material" refers to a material which electronically facilitates the operation of the device. Examples of active materials include, but are not limited to, photoactive materials, and materials which conduct, inject, transport, or block a charge, where the charge can be either a negatively charged electron or a positively charged hole.

The term "alkyl" is intended to mean a group derived from an aliphatic hydrocarbon and includes a linear, a branched, or a cyclic group, which may be unsubstituted or substituted.

The term "alkylaryl" is intended to mean a group having both alkyl and aryl moieties.

The term "alkoxy" is intended to mean an alkyl group which is attached through an oxygen atom.

The term "aryl" is intended to mean a group derived from an aromatic hydrocarbon which may be unsubstituted or substituted.

The term "aryloxy" is intended to mean an aryl group which is attached through an oxygen atom.

The term "buffer layer" is intended to mean an electrically conductive or semiconductive layer and may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. "Buffer materials" are materials suitable to function as a buffer layer.

The term "charge transport," when referring to a layer, material, member, or structure is intended to mean such layer, material, member, or structure facilitates migration of such charge through the thickness of such layer, material, member, or structure with relative efficiency and small loss of charge.

The term "cyclometalated" refers to an organometallic complex in which at least one ligand is coordinated to a metal at two positions, forming a 5- or 6-membered ring with the metal where one of the points of attachment to the metal is via a direct bond to a carbon atom of the ligand The term "electroluminescent" when referring to a material or layer, is intended to mean that such material or layer emits light in response to an electric current passed through it, or to a strong electric field.

The term "electron transport," when referring to a layer, material, member, or structure is intended to mean such layer, material, member, or structure facilitates migration of negative charge through the thickness of such layer, material, member, or structure with relative efficiency and small loss of charge.

The term "hole blocking," when referring to a layer, material, member, or structure is intended to mean such layer, material, member, or structure impedes migration of positive charge through the thickness of such layer, material, member, or structure.

The term "hole transport," when referring to a layer, material, member, or structure is intended to mean such layer, material, member, or structure facilitates migration of positive charge through the thickness of such layer, material, member, or structure with relative efficiency and small loss of charge.

The term "8-hydroxyquinolate" refers to a ligand derived from the compound 8-hydroxyquinoline, wherein the hydrogen on the hydroxy group is removed and the oxygen is coordinated to a metal. The term "layer" is used interchangeably with the term "film" and refers to a coating covering a desired area. The area can be as large as an entire device or a specific functional area such as the actual visual display, or as small as a single sub-pixel. Films can be formed by any conventional deposition technique, including vapor deposition and liquid deposition.

The term "liquid" is intended to include single liquid materials, combinations of liquid materials, and these may be solutions, dispersions, suspensions and emulsions.

The term "liquid deposition" refers to a method for forming a film from a liquid composition. Liquid deposition techniques include, but are not limited to, continuous deposition techniques such as spin coating, gravure coating, curtain coating, dip coating, slot-die coating, spray-coating, roll coating, and continuous nozzle coating; and discontinuous deposition techniques such as ink jet printing, gravure printing, flexographic printing, and screen printing.

The term "organic electronic device" is intended to mean a device including one or more semiconductor layers or materials. Organic electronic devices include, but are not limited to: (1) devices that convert electrical energy into radiation (e.g., a light-emitting diode, light emitting diode display, diode laser, or lighting panel), (2) devices that detect signals through electronic processes (e.g., photodetectors photoconductive cells, photoresistors, photoswitches, phototransistors, phototubes, infrared ("IR") detectors, or biosensors), (3) devices that convert radiation into electrical energy (e.g., a photovoltaic device or solar cell), and (4) devices that include one or more electronic components that include one or more organic semiconductor layers (e.g., a transistor or diode).

The term "organometallic complex" refers to a compound in which a metal atom or ion is coordinated to at least one organic compound or ion. In one embodiment, there is at least one metal-carbon coordination bond.

The term "phenolic compound" refers to an aromatic compound having an OH substituent. The term "phenolate" refers to a ligand derived from a phenolic compound, wherein the H on the OH substituent has been removed and the O is coordinated to a metal.

The term "phosphorescent" refers to an electroluminescent material having an excited state lifetime greater than 50 nanoseconds and/or where the emission occurs via decay of an excited state of the complex having spin triplet character back to the ground state having spin singlet character.

The term "photoactive" refers to a material that emits light when activated by an applied voltage (such as in a light emitting diode or chemical cell) or responds to radiant energy and generates a signal with or without an applied bias voltage (such as in a photodetector).

The term "solvent" refers to a liquid substance capable of dissolving or dispersing one or more other substances.

The term "solvent-solubilizing" refers to a substituent that increases the solubility or dispersability of a material in at least one organic solvent, with respect to the material without the solvent-solubilizing substituent. In the case where the material is a ligand in a metal complex, the solvent-solubilizing substituent increases the solubility or dispersability of the uncomplexed, parent compound from which the ligand is derived.

The term "Tg enhancing" refers to a substituent that raises the glass transition temperature of a material. In other words, the Tg of a compound having the Tg enhancing substituent, is greater that the Tg of the compound without the Tg enhancing substituent. In the case where the material is a ligand in a metal complex, the Tg enhancing substituent increases the Tg of the uncomplexed, parent compound from which the ligand is derived.

The prefix "hetero" indicates that one or more carbon atoms have been replaced with a different atom. The prefix "fluoro" indicates that one or more hydrogen atoms have been replaced with a fluorine atom.

As used herein, "Y" and "Z" are intended to mean ligands on a metal complex.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components of the invention. This is done merely for convenience and to give a general sense of the invention. This description should be read to include one or at least one and the singular also includes the plural unless it is obvious that it is meant otherwise.

Group numbers corresponding to columns within the Periodic Table of the elements use the "New Notation" convention as seen in the *CRC Handbook of Chemistry and Physics*, 81$^{st}$ Edition (2000-2001).

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

2. Organometallic Complex

The organometallic complex has the formula:

$$MY_nZ$$

where:

n is 1, 2, or 3;

M is a metal in a +2, +3, or +4 oxidation state;

Y is the same or different at each occurrence and is selected from the group consisting of 8-hydroxyquinolate and a substituted 8-hydroxyquinolate; and Z is a phenolate.

M is a metal in a +2, +3, or +4 oxidation state. The "n" can be 1, 2, or 3, depending on the oxidation state of M, and is selected so that the overall complex is electrically neutral. In one embodiment, M is Al, Zn, Zr, In or Ga. In one embodiment, M is Al, and n is 2.

Y is an 8-hydroxyquinolate or substituted 8-hydroxyquinolate ligand. At least one Y is a substituted 8-hydroxyquinolate having the formula

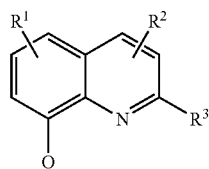

It is understood that in the above formula there are three $R^1$ groups and two $R^2$ groups, where $R^1$ and $R^2$ are H or a substituent, as described above.

At least one of $R^1$ and $R^2$ is a solvent-solubilizing or Tg enhancing group. Examples of suitable solvent-solubilizing groups include, but are not limited to aryl groups having 6-20 carbons, heteroaryl groups having 4-20 carbons, alkyl groups having 1-10 carbons, fluoroalkyl groups having 1-10 carbon atoms Examples of suitable Tg enhancing groups include, but are not limited to aryl groups having 6-20 carbons, heteroaryl groups having 4-20 carbons, alkyl groups having 1-10 carbons In one embodiment at least one of $R^1$ and $R^2$ is an alkyl group having 1-6 carbons. In one embodiment one each of $R^1$ and $R^2$ are alkyl groups having 1-6 carbons, and the others are H.

In one embodiment, at least one of $R^1$ and $R^2$ is an alkylaryl group where the alkyl group has 1-6 carbons and the others are H. In one embodiment, $R^3$ is an alkyl group. In one embodiment, $R^3$ is an alkyl group having 1-3 carbons.

In one embodiment one each of $R^1$ and $R^2$ are alkyl groups having 1-6 carbons and $R^3$ is an alkyl group having 1-3 carbons.

Z is a phenolate. In one embodiment Z is a phenolate having formula I or II:

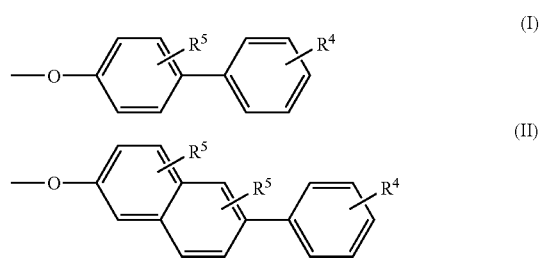

It is understood that in the above formulae there are five $R^4$ groups, where $R^4$ is H or a substituent, as described above. In formula (I), there are four $R^5$ groups, where $R^5$ is H or a substituent, as described above. In formula (II) there are six $R^5$ groups, where $R^5$ is H or a substituent, as described above.

In one embodiment, at least one $R^4$ is a solvent-solubilizing group. In one embodiment, the parent compound for the ligand having formula (I) has a solubility greater than 1.9 wt % in toluene. In one embodiment, the solubility is greater than 2.0 wt % in toluene. In one embodiment, the parent compound for the ligand having formula (II) has a solubility greater than 1.3 wt % in toluene. In one embodiment, the solubility is greater than 1.5 wt % in toluene. Examples of suitable solvent-solubilizing groups are discussed above with respect to $R^1$ and $R^2$.

In one embodiment, at least one $R^4$ is a Tg enhancing group. In one embodiment, the parent compound for the ligand having formula (I) has a Tg greater than 103° C. In one embodiment, the Tg is greater than 105° C. In one embodiment, the parent compound for the ligand having formula (II) has a Tg greater than 112° C. In one embodiment, the Tg is greater than 115° C. Examples of suitable Tg enhancing groups are discussed above with respect to $R^1$ and $R^2$.

In one embodiment, $R^4$ is an alkyl group. In one embodiment, $R^4$ is an alkyl having 1-6 carbons. In one embodiment, Z is a phenolate which incorporates, as part of its structure, a charge transporting component. Examples of charge transporting components include, but are not limited to, triarylamine, triarylmethane, carbazole etc.

3. Composition

In one embodiment, there is provided a composition comprising at least one of the above described complexes.

In one embodiment, the composition further comprises at least one organic solvent. Suitable solvents are those that will sufficiently dissolve, disperse, or emulsify the materials such that an integral film can be formed. A suitable solvent for a particular compound or related class of compounds can be readily determined by one skilled in the art. The solvents can be relatively polar, such as $C_1$ to $C_{20}$ alcohols, ethers, and acid esters, or can be relatively non-polar such as $C_1$ to $C_{12}$ alkanes or aromatics such as toluene, xylenes, trifluorotoluene and the like. Other suitable liquids for use in making the compositions, either as a solution or dispersion as described herein, comprising the new complex, include, but are not limited to, chlorinated hydrocarbons (such as methylene chloride, chloroform, chlorobenzene), aromatic hydrocarbons (such as a substituted or non-substituted toluene or xylene), including trifluorotoluene), polar solvents (such as tetrahydrofuran (THF), N-methylpyrrolidone (NMP)), esters (such as ethylacetate), alcohols (such as isopropanol), ketones (such as cyclopentatone), and any mixture thereof.

In one embodiment, the solvent is an aromatic organic solvent. In one embodiment, the solvent is selected from the group consisting of toluene, anisole, trifluorotoluene, chlorobenzene, dichlorobenzene, xylenes, ethylacetate, 1,2- dichloroethane, tetrahydrofuran, cyclopentanone. In one embodiment, the solvent is selected from the group consisting of toluene and anisole. Mixtures of two or more solvents may also be used.

In one embodiment, the composition further comprises a photoactive material. In one embodiment, the photoactive material is an organometallic complex. In one embodiment, the photoactive material is a phosphorescent electroluminescent emitter. In one embodiment, the photoactive material is a cyclometalated complex of iridium or platinum.

In one embodiment, the composition further comprises a charge transport material. In one embodiment, the charge transport material is a hole transport material. Examples of suitable hole transport materials include, but are not limited, to those discussed below. In one embodiment, the charge transport material is selected from the group consisting of N,N' diphenyl-N,N'-bis(3-methylphenyl)-[1,1'-biphenyl]-4,4'-diamine (TPD), 4,4',4"-tris(N,N-diphenylamino)-triphenylamine (TDATA), 4,4'4"-tris(N-3-methylphenyl-N-phenylamino)-triphenylamine (mTDATA), N,N'-diphenyl-N,N'-bis(1-naphthyl)-[1,1'-biphenyl]-4,4'-diamine (NPB), 2,2-bis-(4-(4',4"-bis-diphenylamino)triphenylamine))-hexafluoropropane (Material A), or polymeric versions of such materials e.g., poly-(4-hexafluoro-i-propylidenyl-NPB)

In one embodiment, the composition comprises at least one of the above described complexes, at least one organic solvent, and at least one photoactive material.

In one embodiment, the composition comprises at least one of the above described complexes, at least one organic solvent, at least one photoactive material, and at least one charge transport material.

The composition may comprise additional materials, such as processing aids and the like.

4. Electronic Device

Turning to FIG. 1, an exemplary organic electronic device 100 is shown. The device 100 includes a substrate 105, a first electrical contact layer 110, a photoactive layer 140, and a second electrical contact layer 170. Other layers, which may or may not be present, include buffer layer 120, hole transport layer 130, electron transport layer 150, electron injection layer 160, and encapsulation layer 180. In some embodiments, the substrate 105 is adjacent the second electrical contact layer 170, and the encapsulation layer is adjacent the first electrical contact layer 110.

The substrate 105 may be rigid or flexible, for example, glass, ceramic, metal, or plastic. When voltage is applied, emitted light is visible through the substrate 105.

A first electrical contact layer 110 is deposited on the substrate 105. For illustrative purposes, the layer 110 is an anode layer. Anode layers may be deposited as lines, and is an electrode that is effective for injecting positive charge carriers. The anode can be made of, for example, materials containing or comprising metal, mixed metals, alloy, metal oxides or mixed-metal oxide. The anode may comprise a conducting polymer, polymer blend or polymer mixtures. Suitable metals include the Group 11 metals, the metals in Groups 4, 5, and 6, and the Group 8-10 transition metals. If the anode is to be light-transmitting, mixed-metal oxides of Groups 12, 13 and 14 metals, such as indium-tin-oxide, are generally used. The anode may also comprise an organic material, especially a conducting polymer such as polyaniline, including exemplary materials as described in "Flexible light-emitting diodes made from soluble conducting polymer," Nature vol. 357, pp 477-479 (11 Jun. 1992). At least one of the anode and cathode should be at least partially transparent to allow the generated light to be observed.

An optional buffer layer 120 may be deposited over the anode layer 110, the latter being sometimes referred to as the "hole-injecting contact layer." Buffer materials may be polymers, oligomers, or small molecules, and may be in the form of solutions, dispersions, suspensions, emulsions, colloidal mixtures, or other compositions. In other embodiments, the charge transport material is a hole-transport material or electron transport material. Examples of charge transport materials, e.g. for layer 120 have been summarized for example, in Kirk Othmer Encyclopedia of Chemical Technology, Fourth Edition, Vol. 18, p. 837-860, 1996, by Y. Wang. Both charge transport "small" molecules as well as oligomers and polymers may be used. Charge transport molecules include, but are not limited to: N,N' diphenyl-N,N'-bis(3-methylphenyl)-[1,1'-biphenyl]-4,4'-diamine (TPD), N,N'-diphenyl-N,N'-bis(1-naphthyl)-[1,1'-biphenyl]-4,4'-diamine (NPB), 1,1 bis[(di-4-tolylamino)phenyl]cyclohexane (TAPC), N,N' bis(4-methylphenyl)-N,N'-bis(4-ethylphenyl)-[1,1'-(3,3'-dimethyl)biphenyl]-4,4'-diamine (ETPD), tetrakis (3-methylphenyl)-N,N,N',N'-2,5-phenylenediamine (PDA), a-phenyl 4-N,N-diphenylaminostyrene (TPS), p (diethylamino)benzaldehyde diphenylhydrazone (DEH), triphenylamine (TPA), bis[4 (N,N-diethylamino)-2-methylphenyl](4-methylphenyl)methane (MPMP), 1 phenyl-3-[p-(diethylamino)styryl]-5-[p-(diethylamino)phenyl]pyrazoline (PPR or DEASP), 1,2 trans-bis(9H-carbazol-9-yl)cyclobutane (DCZB), N,N,N',N' tetrakis(4-methylphenyl)-(1,1'-biphenyl)-4,4'-diamine (TTB), 4,4',4"-tris(N,N-diphenylamino)-triphenylamine (TDATA), 4,4'4"-tris(N-3-methylphenyl-N-phenylamino)triphenylamine (mTDATA) and porphyrinic compounds, such as copper phthalocyanine. Useful charge transport polymers include, but are not limited to, polyvinylcarbazole, (phenylmethyl)polysilane, polythiophenes, polyanilines, and polypyrroles. Conducting polymers are useful as a class. It is also possible to obtain charge transport polymers by doping charge transport moieties, such as those mentioned above, into polymers such as polystyrenes and polycarbonates.

In one embodiment, the buffer layer 120 comprises a complex of a conducting polymer and a colloid-forming polymeric acid. Such materials have been described in published U.S. applications 2004/0254297 and 2004/0127637.

The optional hole transport layer 130 can be made of any of the materials described above for the buffer layer 120.

In one embodiment, the hole transport layer 130 comprises a crosslinkable polymeric material. The crosslinkable polymeric material may contain hole transport moieties such as triarylamine groups, carbazole groups, oxadiazole groups, and the like.

An organic layer 140 may be deposited over the buffer layer 120 or hole transport layer 130, when present, or over the first electrical contact layer 110. In some embodiments, the organic layer 140 may be a number of discrete layers comprising a variety of components. Depending upon the application of the device, the organic layer 140 can be a light-emitting layer that is activated by an applied voltage (such as in a light-emitting diode or light-emitting electrochemical cell), a layer of material that responds to radiant energy and generates a signal with or without an applied bias voltage (such as in a photodetector).

Any organic electroluminescent ("EL") material can be used as a photoactive material, e.g. in layer 130. Such materials include, but are not limited to, fluorescent dyes, small molecule organic fluorescent compounds, fluorescent and phosphorescent metal complexes, conjugated polymers, and mixtures thereof. Examples of fluorescent dyes include, but are not limited to, pyrene, perylene, rubrene, derivatives thereof, and mixtures thereof. Examples of metal complexes include, but are not limited to, metal chelated oxinoid compounds, such as tris(8-hydroxyquinolato)aluminum (Alq3); cyclometalated iridium, osmium, rhenium and platinum electroluminescent compounds, such as complexes of Iridium with phenylpyridine, phenylquinoline, or phenylpyrimidine ligands as disclosed in Petrov et al., Published PCT Application WO 02/02714, and organometallic complexes described in, for example, published applications US 2001/0019782, EP 1191612, WO 02/15645, and EP 1191614; and mixtures thereof. Electroluminescent emissive layers comprising a charge carrying host material and a metal complex have been described by Thompson et al., in U.S. Pat. No. 6,303,238, and by Burrows and Thompson in published PCT applications WO 00/70655 and WO 01/41512. Examples of conjugated polymers include, but are not limited to poly(phenylenevinylenes), polyfluorenes, poly(spirobifluorenes), polythiophenes, poly(p-phenylenes), copolymers thereof, and mixtures thereof.

In one embodiment of the devices, the photoactive material can be an organometallic complex. In another embodiment, the photoactive material is a cyclometalated complex of iridium, osmium, rhenium or platinum. Other useful photoactive materials may be employed as well. Complexes of Iridium with phenylpyridine, phenylquinoline, phenylisoquinoline, or phenylpyrimidine ligands have been disclosed as electroluminescent compounds in Petrov et al., Published PCT Application WO 02/02714. Other organometallic complexes have been described in, for example, published applications US 2001/0019782, EP 1191612, WO 02/15645, and EP 1191614. Electroluminescent devices with an active layer of polyvinyl carbazole (PVK) doped with metallic complexes of iridium have been described by Burrows and Thompson in published PCT applications WO 00/70655 and WO 01/41512. Electroluminescent emissive layers comprising a charge carrying host material and a phosphorescent platinum complex have been described by Thompson et al., in U.S. Pat. No. 6,303,238, Bradley et al., in Synth. Met. (2001), 116 (1-3), 379-383, and Campbell et al., in Phys. Rev. B, Vol. 65 085210.

In one embodiment, layer 140 comprises a compound having the formula $MY_nZ$, as described herein. In one embodiment, layer 140 comprises a compound having the formula $MY_nZ$, as described herein, and further comprises an organometallic emissive material, such as those described above.

Optional electron transport layer 150 and electron injection layer 160 generally comprise electron transport materials. Examples of electron transport materials include, but are not limited to, metal chelated oxinoid compounds, such as bis(2-methyl-8-quinolinolato)(para-phenyl-phenolato)aluminum (III) (BAIQ) and tris(8-hydroxyquinolato)aluminum ($Alq_3$); azole compounds such as 2-(4-biphenylyl)-5-(4-t-butylphenyl)-1,3,4-oxadiazole (PBD), 3-(4-biphenylyl)-4-phenyl-5-(4-t-butylphenyl)-1,2,4-triazole (TAZ), and 1,3,5-tri(phenyl-2-benzimidazole)benzene (TPBI); quinoxaline derivatives such as 2,3-bis(4-fluorophenyl)quinoxaline; phenanthroline derivatives such as 9,10-diphenylphenanthroline (DPA) and 2,9-dimethyl-4,7-diphenyl-1,10-phenanthroline (DDPA); and mixtures thereof. Electron injection layer 160 can also be an inorganic material. Li-containing and other compounds, such as LiF and $Li_2O$, may be used.

In one embodiment, layer 150 comprises a compound having the formula $MY_nZ$, as described herein.

A second electrical contact layer 170 is deposited on the organic layer 140, or optional layers 150 or 160. For illustrative purposes, the layer 170 is a cathode layer.

Cathode layers may be deposited as lines or as a film. The cathode can be any metal or nonmetal having a lower work function than the anode. Exemplary materials for the cathode can include alkali metals of Group 1, especially lithium, the Group 2 (alkaline earth) metals, the Group 12 metals, including the rare earth elements and lanthanides, and the actinides. Materials such as aluminum, indium, calcium, barium, samarium and magnesium, as well as combinations, can be used.

An encapsulation layer 170 is deposited over the contact layer 160 to prevent entry of undesirable components, such as water and oxygen, into the device 100. Such components can have a deleterious effect on the organic layer 130. In one embodiment, the encapsulation layer 170 is a barrier layer or film. In one embodiment, the encapsulation layer is a glass or metal lid.

Though not depicted, it is understood that the device 100 may comprise additional layers. Other layers that are known in the art or otherwise may be used. In addition, any of the above-described layers may comprise two or more sub-layers or may form a laminar structure. Alternatively, some or all of anode layer 110, the buffer layer 120, the charge transport layer 130, the electron transport layers 150 and 160, cathode layer 170, and other layers may be treated, especially surface treated, to increase charge carrier transport efficiency or other physical properties of the devices. The choice of materials for each of the component layers is preferably determined by balancing the goals of providing a device with high device efficiency with device operational lifetime considerations, fabrication time and complexity factors and other considerations appreciated by persons skilled in the art. It will be appreciated that determining optimal components, component configurations, and compositional identities would be routine to those of ordinary skill in the art.

In one embodiment, the different layers have the following range of thicknesses: anode 110, 500-5000 Å, in one embodiment 1000-2000 Å; buffer layer 120 and hole transport layer 130, 50-2000 Å, in one embodiment 200-1000 Å; photoactive layer 140, 10-2000 Å, in one embodiment 100-1000 Å; layers 150 and 160, 50-2000 Å, in one embodiment 100-1000 Å; cathode 170, 200-10000 Å, in one embodiment 300-5000 Å. The location of the electron-hole recombination zone in an OLED device, and thus the emission spectrum of the device, can be affected by the relative thickness of each layer. Thus the thickness of the electron-transport layer should be chosen so that the electron-hole recombination zone is in the light-emitting layer. The desired ratio of layer thicknesses will depend on the exact nature of the materials used.

In operation, a voltage from an appropriate power supply (not depicted) is applied to the device 100. Current therefore passes across the layers of the device 100. Electrons enter the organic polymer layer, releasing photons. In some OLEDs, called active matrix OLED displays, individual deposits of photoactive organic films may be independently excited by the passage of current, leading to individual pixels of light emission. In some OLEDs, called passive matrix OLED displays, deposits of photoactive organic films may be excited by rows and columns of electrical contact layers.

The devices comprising a complex as described herein can be prepared employing a variety of techniques. These include, by way of non-limiting exemplification, vapor deposition techniques, liquid deposition techniques, and thermal transfer techniques.

EXAMPLES

Example 1

Example 1 illustrates the preparation of a solubilzed Al complex using 2-methyl-5-t-butyl-8-hydroxyquinoline. The Al complex has the structure:

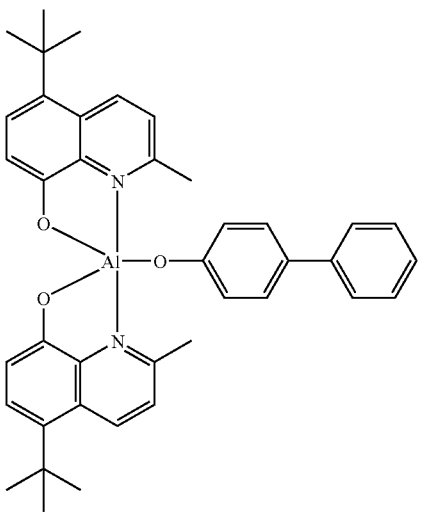

1a Preparation of the Substituted
8-Hydroxyquinoline Parent Compound

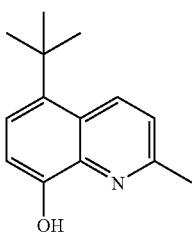

To a 500 mL flask was added 15.0 g of 2-amino-4-(t-butyl) phenol (Aldrich), and 75 ml acetic acid. To the resulting stirred suspension was added 5.85 g of 4-(t-butyl)-2-nitrophenol and 150 ml conc. HCl. The reaction mixture was heated to 80° C. and 15.03 g of crotonaldehyde (Aldrich) was added over 30 min. The resulting reaction mixture was heated to 130° C. for 16 h. The reaction mixture was cooled to room temperature, poured into 150 ml cold water and neutralized with 15% NaOH, resulting in a tan precipitate. The tan precipitate was collected by extraction into ethyl acetate. The extracts were dried over sodium sulfate, filtered and concentrated to a solid. The solid was suspended in 150 mL dichloromethane and filtered to remove unreacted anilines. The filtrate was concentrated to an oil which was purified by column chromatography, eluting with 50% chloroform/hexanes followed by 100% chloroform to give the desired product (1.27 g) as a tan solid.

1b Preparation of the Aluminum Complex of the
Ligand Derived from 1a

Figure 2:
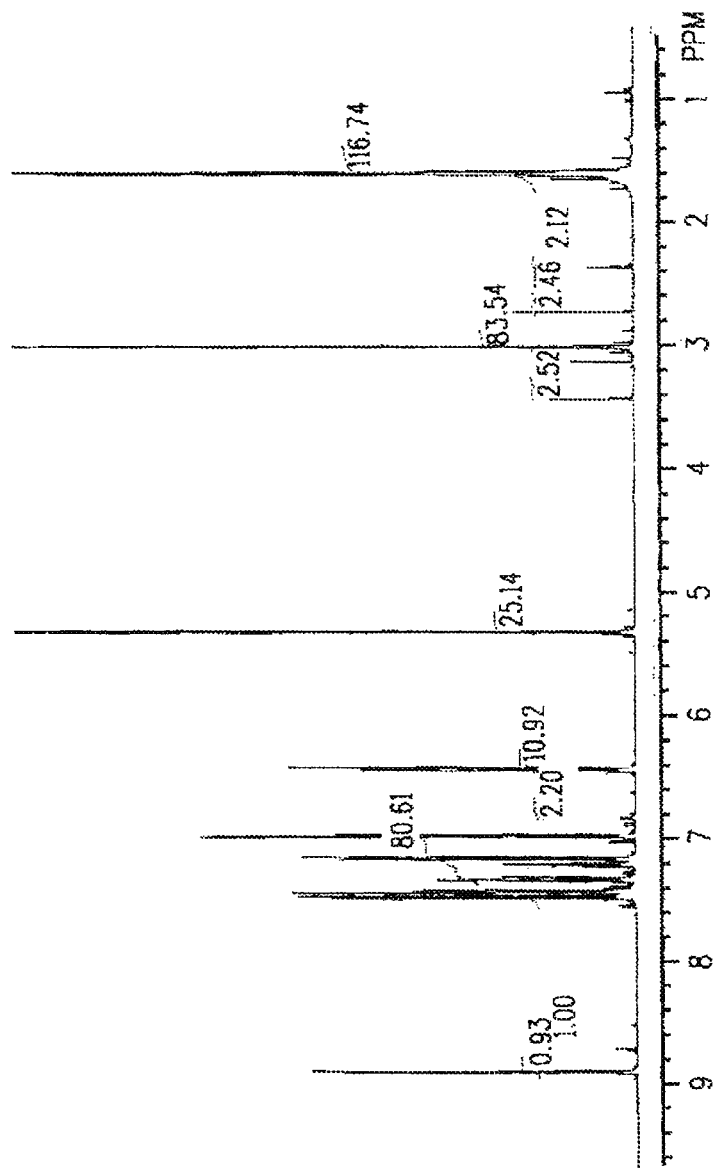
FIG. 2 is the 1-H nmr spectrum of product 1b.
Figure 3:
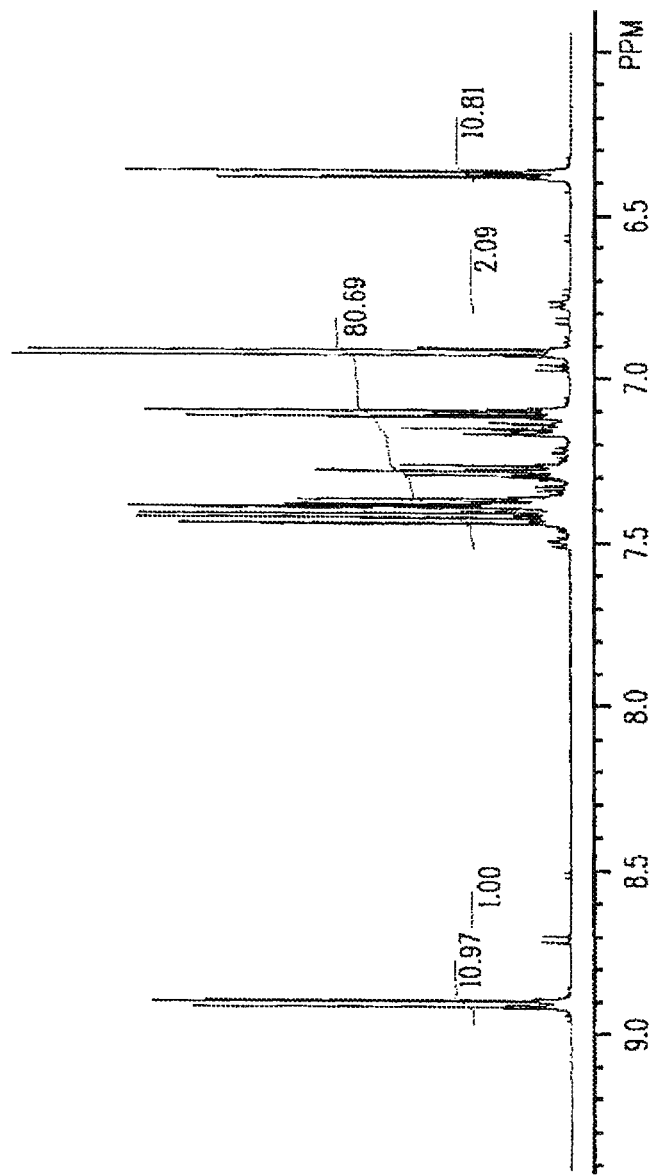
FIG. 3 is the 1-H nmr spectrum of product 1b, (aromatic region).

In a glove box, 0.6 g of the quinoline parent compound prepared in 1a was dissolved into 25 mL toluene with stirring in a 100 mL RB flask. 0.74 mL of 1.9M triethylaluminum in toluene solution (Aldrich) was added via syringe and with rapid stirring. There is much foaming and addition must be done slowly to prevent overflow. The solution was brought to reflux in a heating mantle and it becomes clear yellow. 0.24 g 4-phenylphenol(Aldrich) was added as a solid with heat and stirring. The solution becomes clear yellow and was stirred and refluxed with air condensor for ½ hr then cooled to room temperature. Addition of hexanes with continued stirring leads to a pale lemon yellow precipitate which was collected by filtration, washed with methanol and hexanes and suction dried to yield 1.0 g of product. 1-H nmr in methylene chloride revealed the expected product 1b (See FIGS. 2 [1-H nmr spectrum of product 1b)] and 3 [1-H nmr spectrum of product 1b, [aromatic region]) contaminated with small amounts of minor isomeric materials. The material product 1b was sublimed in high vacuum prior to device fabrication work. This compound has enhanced solubility in toluene of >1.9 wt % and an enhanced Tg of ~135° C.

Example 2

Example 2 illustrates the preparation of a solubilized Al complex using 2-methyl-5-(4-t-butylphenyl)-8-hydroxyquinoline. The Al complex has the structure:

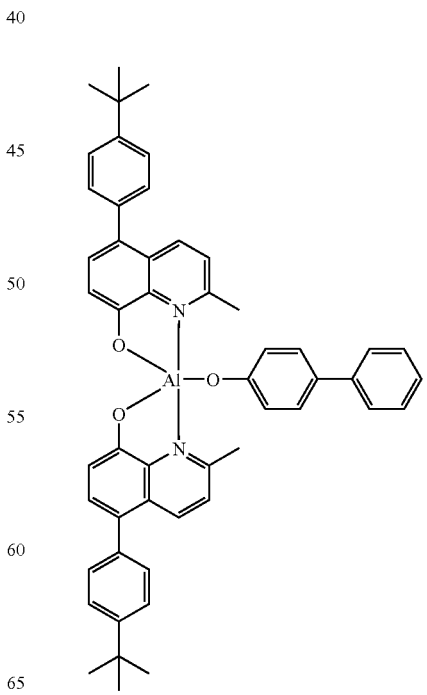

2a Preparation of the 8-Hydroxyquinoline Parent Compound

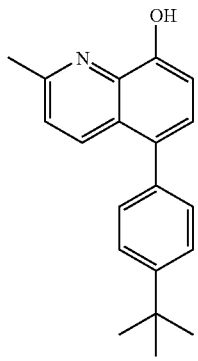 [SMILES: Cc1ccc2c(-c3ccc(C(C)(C)C)cc3)ccc(O)c2n1]

Into a 2 L flask was added 38.4 g of 8-hydroxyquinaldine (Aldrich), 17.24 g imidazole (Aldrich) and 500 mL of dry dichloromethane. The solution was stirred under nitrogen to completely dissolve the reagents. To the solution was added 40.0 g of t-butyldimethylsilyl chloride in small portions over 30 min. After addition was complete, an additional 50 mL dichloromethane was added and the reaction mixture was stirred under nitrogen atmosphere for 16 h. The reaction mixture was transferred to a 1 L separatory funnel and washed with 100 mL of 0.1 m HCl, 100 mL water, 100 mL brine and then dried over $MgSO_4$. The solution was filtered and concentrated and dried under high vacuum to give 8-(t-butyl)dimethylsiloxyquinaldine (compound 2i) as a dark yellow oil 67.0 g (97%) which was used directly in the next step.

To a 500 mL flask was added 400 mL dichloromethane and 31.5 g 8-(t-butyl)dimethylsiloxyquinaldine. The mixture was vigorously stirred while 33.14 g bromine (Aldrich) dissolved in 20 mL dichloromethane was added dropwise. The reaction progress was monitored by TLC (5:95 ethylacetate:hexanes). The starting material was found to be completely consumed. Excess bromine was removed by addition of 200 mL of saturated sodium thiosulfate (Aldrich). The organic layer was separated, washed with 150 ml water, 150 ml brine and then dried over $MgSO_4$. After filtering off the salts, the filtrate was concentrated to an oil which was purified by column chromatography, eluting with 20% dichloromethane/hexanes to give 26.04 g of 5-bromo-8-(t-butyl)dimethylsiloxyquinaldine (compound 2ii) as a yellow oil.

In a glove box, 5-bromo-8-(t-butyl)dimethylsiloxyquinaldine 8.0 g, $Pd(PPh_3)_4$,(Aldrich) 1.31 g, and tetrabutylammonium bromide (Aldrich), 0.732 g were weighed into a 500 ml flask. To the flask was added 200 ml dry, degassed toluene followed by 4.45 g of 4-t-butylphenylboronic acid (Aldrich). The flask was capped and removed to a fume hood where it was placed under nitrogen atmosphere. To the mixture was added 200 mL of 1M sodium carbonate solution and the resulting mixture was heated to 90 C for 20 h. The reaction mixture was cooled to room temperature and the phases separated. The organic phase was washed 2× with 100 mL water and dried over sodium sulfate. After filtering, the solvent was removed to give a yellow oil. The crude product was purified by elution from a silica gel column with 30% dichloromethane in hexanes as the eluent. Product containing fractions were combined and concentrated to give 6.7 g of the desired product, 5-(4-t-butyl-phenyl)-2-methyl-8-t-butyldimethylsiloxyquinoline (compound 2iii), as a pale yellow oil.

To a 300 mL flask was added 6.7 g of 5-(4-t-butyl-phenyl)-2-methyl-8-t-butyldimethylsiloxyquinoline and 100 ml dry THF. The mixture was stirred under nitrogen while 13.5 ml triethylamine trihydrofluoride (Aldrich) was added in 5 portions over 30 min. The reaction mixture was stirred at room temperature for 2 h and the solvents removed in vacuo. The resulting oil was purified by silica chromatography, first eluting with 15% dichloromethane in hexanes and then collecting the product by elution with 50% dichloromethane in hexanes to give 4.33 g of the desired product quinaldine 2a as a colorless solid.

2 b Preparation of the Aluminum Complex of the Parent Compound from 2a

Figure 4A:
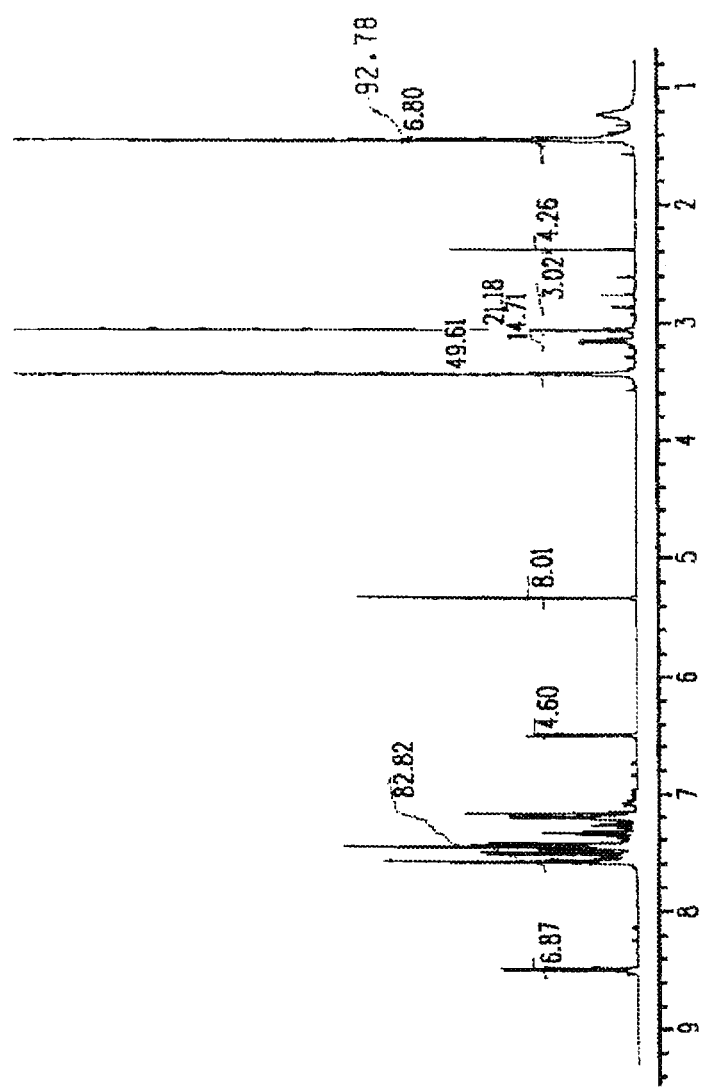
FIG. 4A is the 1-H nmr spectrum of product 2b.
Figure 4B:
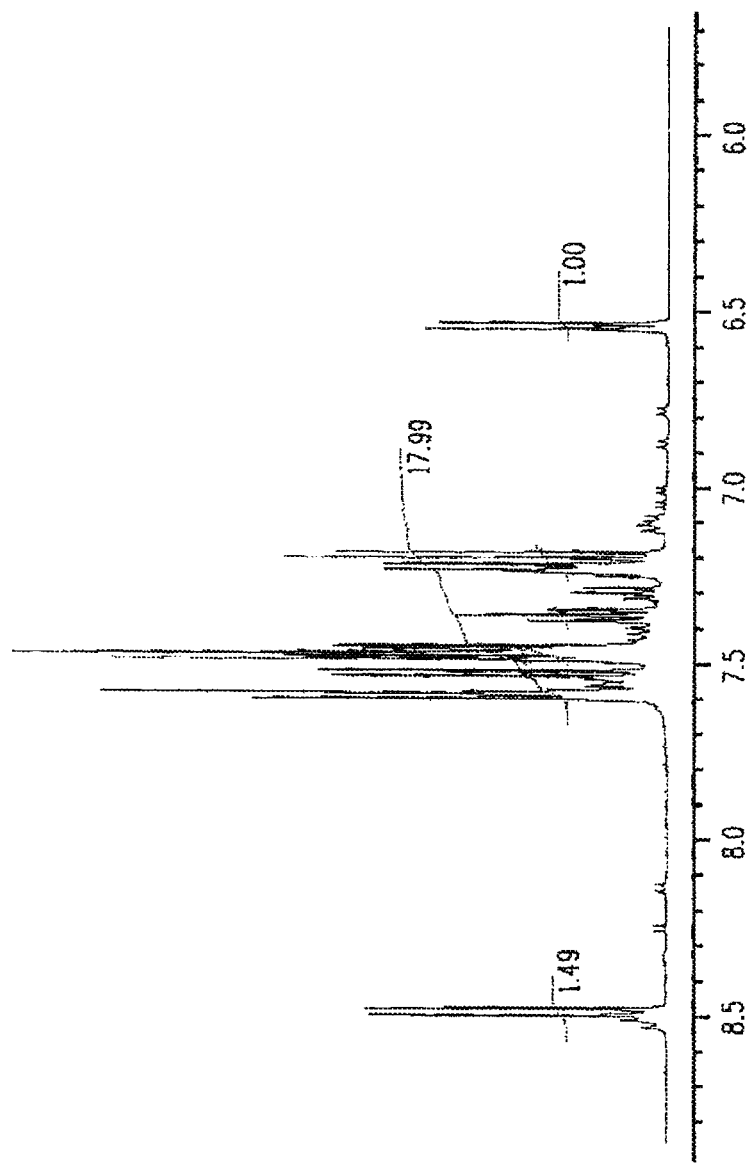
FIG. 4B is the 1-H nmr spectrum of product 2b, (aromatic region).

In a glove box, 2.91g of quinaldine 2a was dissolved into 10 mL toluene with stirring in a 100 mL RB flask. 2.65 mL of 1.9M triethylaluminum in toluene solution (Aldrich) was added with a syringe and rapid stirring. There is much foaming and addition must be done slowly to prevent overflow. The solution becomes bright yellow and clear. The solution was brought to reflux in a heating mantle and it remains clear yellow. 0.85 g 4-phenylphenol (Aldrich) was added as a solid and the clear solution was heated and stirred. The solution was refluxed with an air condensor for 30 mins then cooled. Methanol was added to consume any excess AlEt3. The solution was then evaporated to dryness in vacuum to give the product as a yellow glass. Recrystallization from methylene chloride/methanol yielded the product as a bright yellow powder. 1H-nmr of product 2b (see FIGS. 4A and 4B) in methylene chloride shows the material product 2b contains minor amounts of related isomeric compounds. The material was sublimed in high vacuum prior to evaluation in OLED devices. This compound has enhanced solubility in toluene of >2.8 wt % and an enhanced Tg of ~170° C.

Example 3

Preparation of the Aluminum Complex of the Parent Compound from 2a

Example 3 illustrates the preparation of a solubilized Al complex using 2-methyl-5-(4-t-butylphenyl)-8-hydroxyquinoline. The Al complex has the structure:

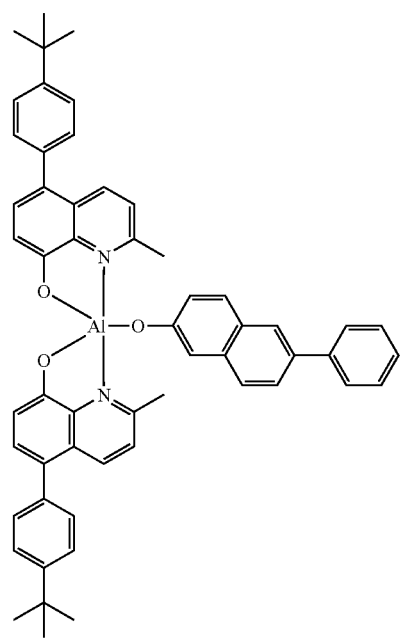

Figure 5A:
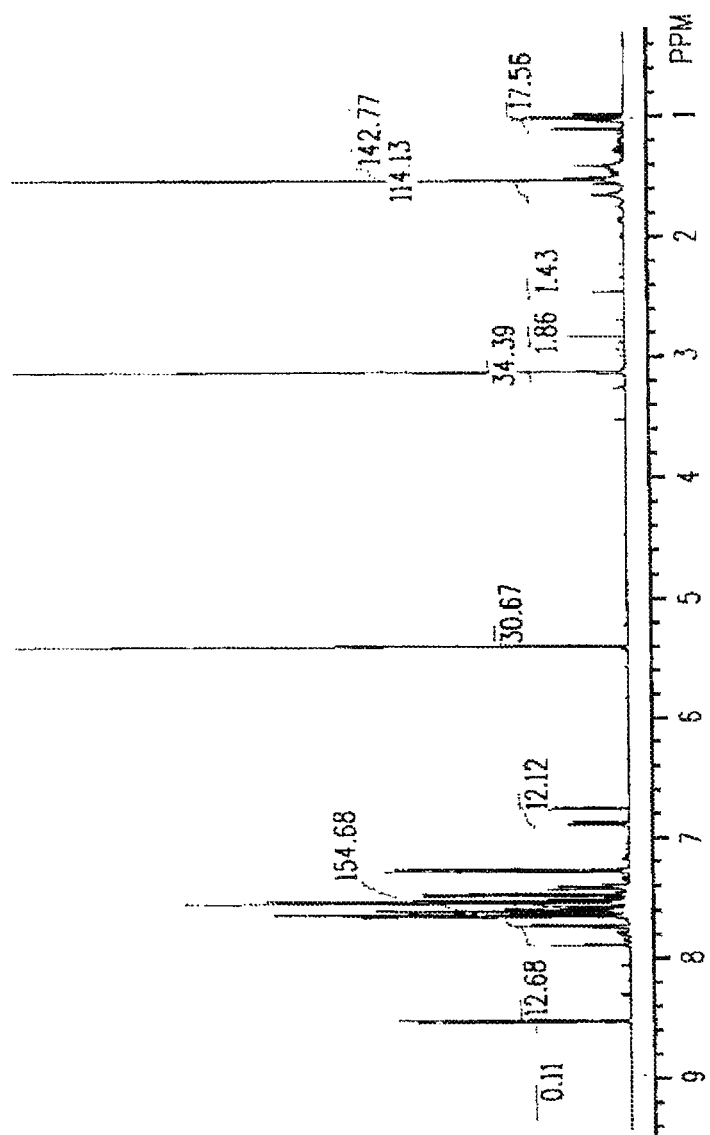
FIG. 5A is the 1-H nmr spectrum of product 3.
Figure 5B:
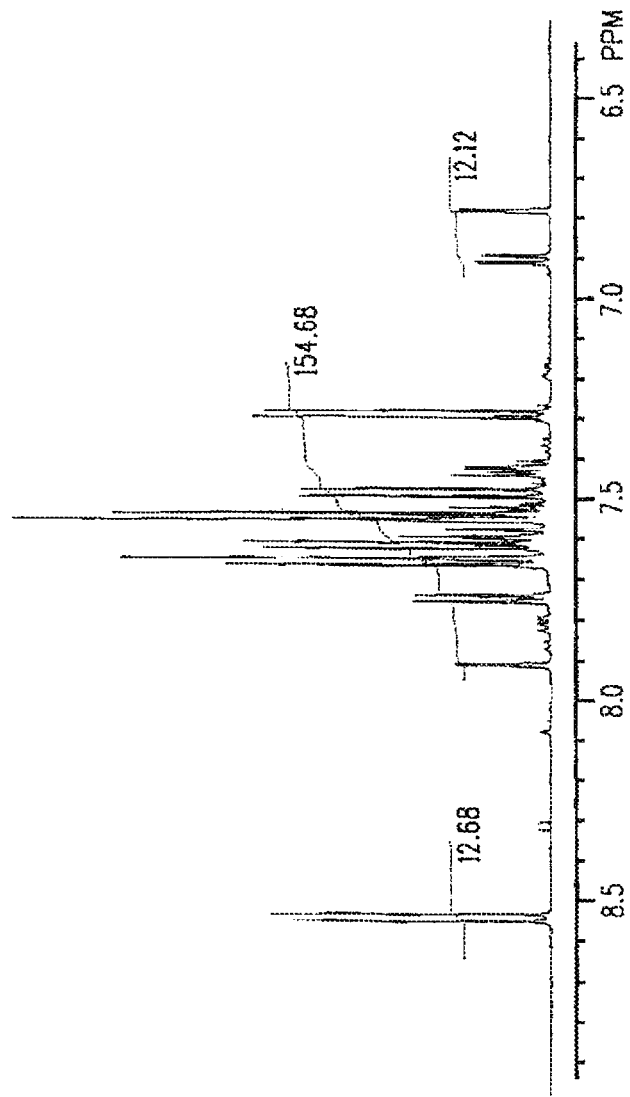
FIG. 5B is the 1-H nmr spectrum of product 3, (aromatic region).

In a glove box, 2.91 g of quinaldine 2a was dissolved into 10 mL toluene with stirring in a 100 mL RB flask. 2.65 mL of 1.9 M triethylaluminum in toluene solution (Aldrich) was added with a syringe and rapid stirring. There is much foaming and addition must be done slowly to prevent overflow. The solution becomes bright yellow and clear. The solution was brought to reflux in a heating mantle and it remains clear yellow. 1.10 g 6-phenyl-2-naphthol was added as a solid and the clear solution was heated and stirred. The solution was refluxed with an air condensor for 30 mins then cooled. Methanol was added to consume any excess AlEt$_3$. The solution was then evaporated to dryness in vacuum to give the product as a yellow glass. Recrystallization from toluene/methanol yielded 3.5 g of the product as pale yellow crystals. 1H-nmr in methylene chloride shows the material, product 3 (see FIGS. 5A and 5B), contains minor amounts of related isomeric compounds. The material product 3 was sublimed under high vacuum prior to evaluation in OLED devices. This compound has enhanced solubility in toluene of >2.0 wt % and an enhanced Tg of ~166° C.

Example 4

Example 4 illustrates the preparation of a solubilized Al complex using 2-methyl-5-isobutyl-8-hydroxyquinoline. The Al complex has the structure:

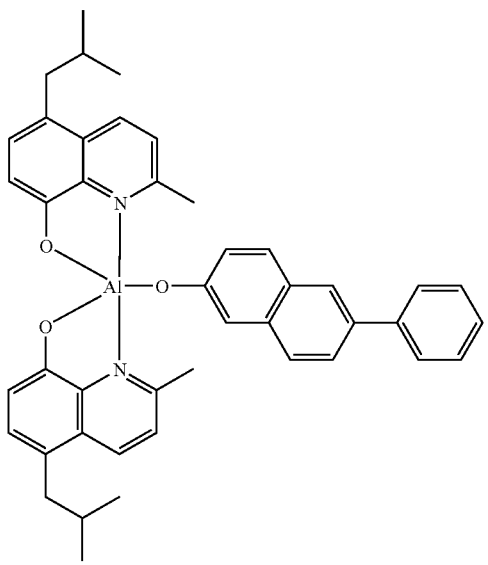

4a Preparation of the Substituted 8-Hydroxyquinoline Parent Compound

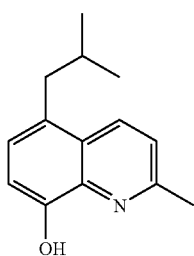 [SMILES: Cc1ccc2c(CC(C)C)ccc(O)c2n1]

In a glove box, 10.0 g of 5-bromo-8-[(t-butyl)dimethylsiloxy]quinaldine (compound 2ii from example 2a above) and 0.2 g [1,3-bis(diphenylphosphino)propane]-dichloronickel (II) (Aldrich) were added to a 250 mL two neck flask fitted with thermometer port and reflux condenser. After adding 75 mL dry degassed THF, the flask was sealed and removed form the dry box. While cooling in an ice bath, 17.75 mL of a 2.0 M solution of isobutylmagnesium bromide in THF (Aldrich) was added over a 15 min period. After the addition was complete, the cooling was removed and the reaction mixture stirred for 30 min. The mixture was then heated to 60 C for 90 min when TLC analysis (5% EtOAc/Hexanes) showed the starting bromide to be consumed. The reaction mixture was cooled to room temperature and quenched by the addition of 10 mL 1M HCl. The mixture was diluted with 50 mL brine and extracted into ether (3×50 mL). The combined ether layers were washed with 5% NaHCO$_3$ and brine, then dried over sodium sulfate and condensed to a brown oil. Purification was achieved by elution from a silica gel column with 2% EtOAc in hexanes. The product fractions were combined to give 8.0 g of a yellow oil which was taken to the next step.

To a solution of 8.0 g of the oil from above in 80 mL dry THF was added 20 mL triethylamine trihydrofluoride (Aldrich) in four portions. The mixture was stirred for 2 h, at which point the starting material had been consumed. The solvents were removed under vacuum giving 5.0 g of a yellow oil. The oil was purified using a preparative HPLC on C-18 column eluting with a gradient 5% acetonitrile to 100% acetonitrile over 25 min at 20 mL per minute flow rate. The combined products were concentrated and dried under high vacuum to give 1.2 g of the desired product, 5-isobutyl-8-hydroxyquinaldine, as a yellow solid.

4b Preparation of the Aluminum Complex of the Parent Compound from 4a

Figure 6A:
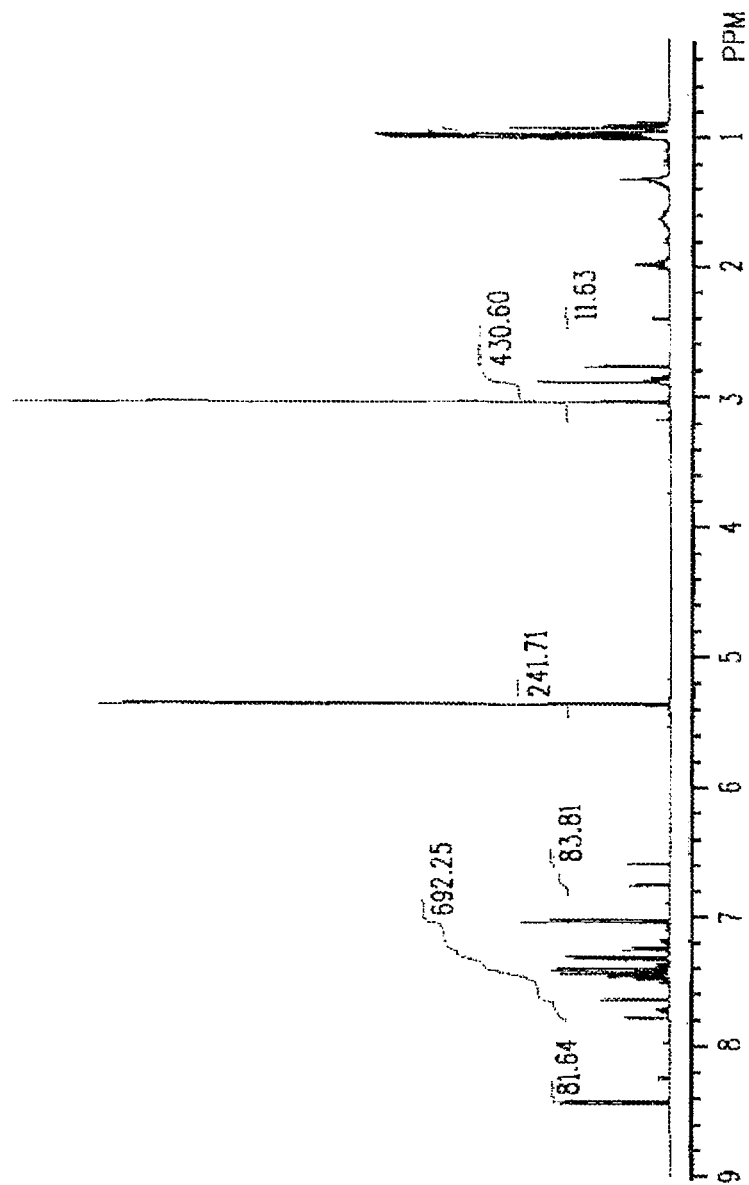
FIG. 6A is the 1-H nmr spectrum of product 4b.
Figure 6B:
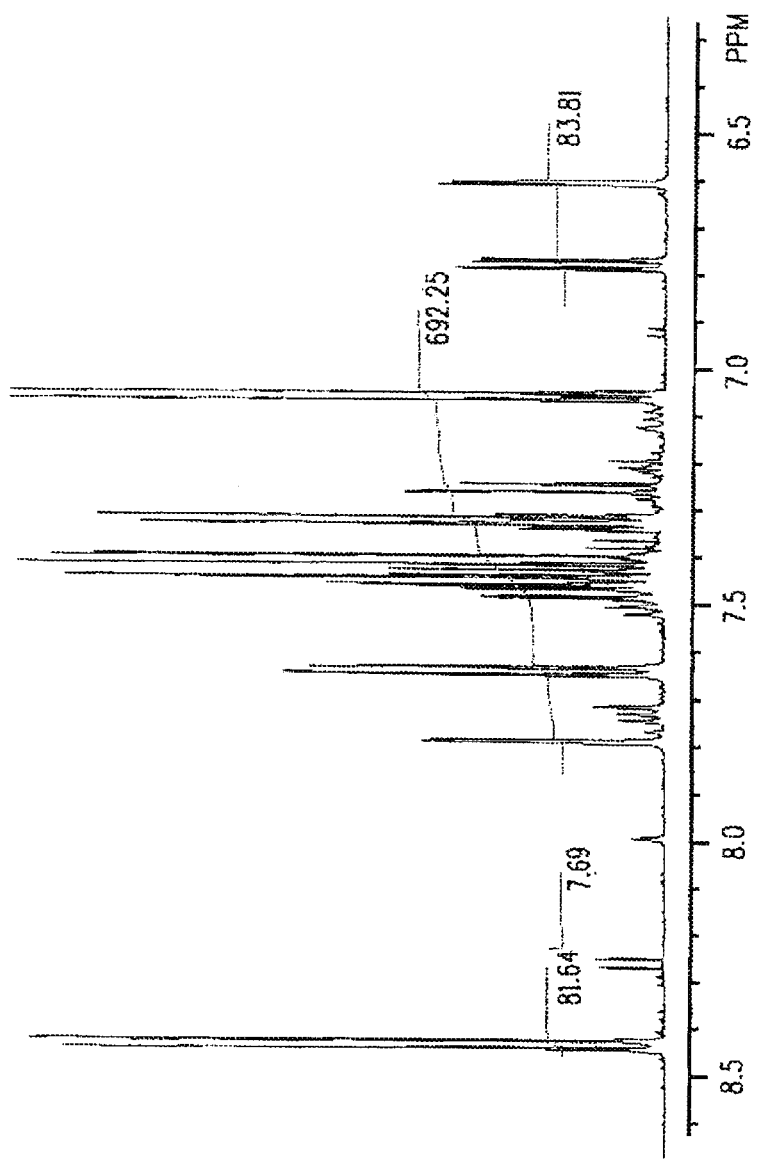
FIG. 6B is the 1-H nmr spectrum of product 4b, (aromatic region).

In a glove box, 1.20 g of quinaldine 4 a was dissolved into 10 mL toluene with stirring in a 100 mL RB flask. 1.47 mL of 1.9 M triethylaluminum in toluene solution (Aldrich) was added with a syringe and rapid stirring. There is much foaming and addition must be done slowly to prevent overflow. The solution becomes bright yellow and clear. The solution was brought to reflux in a heating mantle and it remains clear yellow. 0.61 g 6-phenyl-2-naphthol was added as a solid and the clear solution was heated and stirred. The solution was refluxed with an air condensor for 30 mins then cooled. Methanol was added to consume any excess AlEt$_3$. The solution was then evaporated to dryness in vacuum to give the product as a yellow oily glass. Recrystallization from methylene chloride/hexanes yielded 1.2 g of the product as pale yellow platelet crystals. 1H-nmr of product 4b in methylene chloride shows the material product 4b contains minor amounts of related isomeric compounds. (See FIGS. 6A and 6B) The material product 4b was sublimed under high vacuum prior to evaluation in OLED devices. This compound has enhanced solubility in toluene of >2.0 wt % and a Tg of ~103° C.

Example 5

Example 5 demonstrates device fabrication by liquid processing, and subsequent device characterization.

OLED devices were fabricated by a combination of liquid processing and thermal evaporation techniques. Patterned indium tin oxide (ITO) coated glass substrates from Thin Film Devices, Inc were used. These ITO substrates are based on Corning 1737 glass coated with 1400 Å of ITO having a sheet resistance of 30 ohms/square and 80% light transmission. The patterned ITO substrates were cleaned ultrasonically in aqueous detergent solution and rinsed with distilled water. The patterned ITO was subsequently cleaned ultrasonically in acetone, rinsed with isopropanol, and dried in a stream of nitrogen.

Immediately before device fabrication the cleaned, patterned ITO substrates were treated with $O_2$ plasma for 5 minutes. Immediately after cooling, a buffer material, Buffer 1, was spin-coated from an aqueous dispersion over the ITO surface. The cathode leads were wiped clean with damp swabs and the substrates were then baked in air at 130° C. for 7 minutes. After cooling, the substrates were then spin-coated with a 0.4% w/v solution of Hole Transport 1 in toluene, the cathode leads were wiped clean with damp swabs, and the substrates were baked in an argon atmosphere for 30 minutes. After cooling, the substrates were spin-coated with the emissive layer materials in toluene. The emissive layer comprised a red emitter, a complex as described herein, and a second material, Material A. The cathode contacts were then wiped clean with toluene wetted swabs and the substrates were baked in an argon atmosphere for 30 minutes. The substrates were masked and placed in a vacuum chamber. After pumping to a pressure of $3 \times 10^{-7}$ torr, an electron transport layer of ZrQ was deposited by thermal evaporation, followed by an electron injection layer of LiF. Masks were then changed in vacuo and a cathode layer of Al was deposited by thermal evaporation. The chamber was vented to argon and the devices were encapsulated using a glass lid, dessicant, and UV curable epoxy.

The OLED samples were characterized by measuring their (1) current-voltage (I-V) curves, (2) electroluminescence radiance versus voltage, and (3) electroluminescence spectra versus voltage. All three measurements were performed at the same time and controlled by a computer. The current efficiency of the device at a certain voltage is determined by dividing the electroluminescence radiance of the LED by the current density needed to run the device. The unit is a cd/A. The power efficiency is the current efficiency divided by the operating voltage. The unit is lm/W.

The materials used in device fabrication are listed below:
Buffer 1 was an aqueous dispersion of poly(3,4-dioxythiophene) and a polymeric fluorinated sulfonic acid. The material was prepared using a procedure similar to that described in Example 3 of published U.S. patent application no. 2004/0254297.
Hole Transport 1 was a crosslinkable polymeric material.
Material A

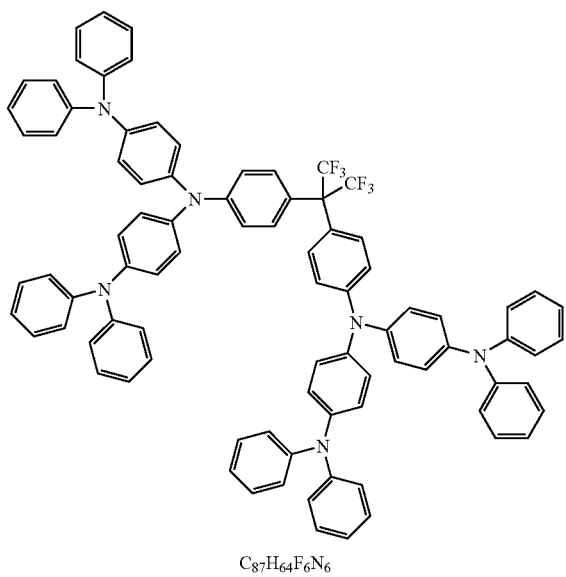

$C_{87}H_{64}F_6N_6$
Exact Mass: 1306.51
Mol. Wt.: 1307.47

Red emitter 1:

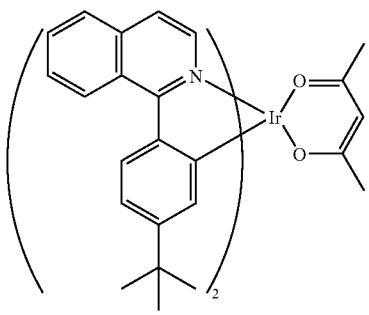

ZrQ: Tetrakis-(8-hydroxyquinoline) zirconium
Device configurations and layer thicknesses are given below.

Example 5.1

ITO
Buffer 1 (20 nm)
Hole Transport 1 (20 nm), baked at 195° C.
[Material of Example 1: Material A (4:1)]: Red emitter 1 (92:8) (55 nm), baked at 90° C.
ZrQ (20 nm)
LiF (0.5 nm)
Al (100 nm)

Example 5.2

ITO
Buffer 1 (20 nm)
Hole Transport 1 (20 nm), baked at 195° C.
[Material of Example 2: Material A (4:1)]: Red emitter 1 (92:8) (55 nm), baked at 90° C.
ZrQ (20 nm)
LiF (0.5 nm)
Al (100 nm)

TABLE I

| device characterization data | | | |
|---|---|---|---|
| | Current efficiency at 500 nits, cd/A | Power efficiency at 500 nits, lm/W | Color coordinates, (x, y) |
| Example 5.1 | 8.7 | 4.0 | (0.68, 0.31) |
| Example 5.2 | 9.5 | 4.0 | (0.68, 0.31) |

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

What is claimed is:
1. An organometallic complex having the formula:

$MY_nZ$ where:
n is 1, 2, or 3;
M is a metal in a +2, +3, or +4 oxidation state;

Y is the same or different at each occurrence and is selected from the group consisting of 8-hydroxyquinolate and a substituted 8-hydroxyquinolate; and Z has the formula I or II;

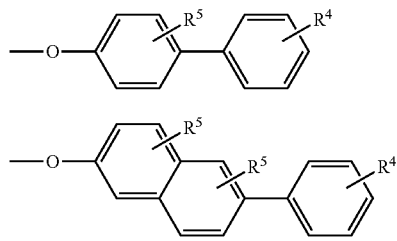

wherein $R^4$ and $R^5$ are independently selected and each is one or more of a substituent selected from the group consisting of H, alkyl, substituted alkyl, aryl, substituted aryl, F, CN, a solvent-solubilizing group, and a Tg enhancing group; and wherein at least one Y is a substituted 8-hydroxyquinolate having the formula

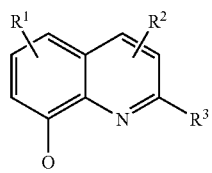

where:

$R^1$ and $R^2$ are the same or different at each occurrence and each represents one or more of a substituent selected from the group consisting of H, alkyl, fluoroalkyl, aryl, fluoroaryl, alkylaryl, alkoxy, aryloxy, fluoroalkoxy, fluoroaryloxy, heteroalkyl, fluoroheteroalkyl, heteroaryl, fluoroheteroaryl, heteroalkylaryl, heteroalkoxy, heteroaryloxy, fluoroheteroalkoxy, fluoroheteroaryloxy, cyano, dialkylamino, diarylamine, halide, wherein at least one of $R^1$ and $R^2$ is selected from the group consisting of an aryl group having 6-20 carbons and a heteroaryl group having 4-20 carbons; and $R^3$ is selected from the group consisting of H, an alkyl group, and a substituted alkyl group.

2. The complex of claim 1, wherein M is selected from the group consisting of Al, Zn, Zr, In and Ga.

3. The complex of claim 1, wherein M is Al.

4. The complex of claim 1, wherein one of $R^1$ and $R^2$ is an alkyl group.

5. The complex of claim 4, wherein the alkyl has 1-6 carbons.

6. The complex of claim 1, wherein one of $R^1$ and $R^2$ is an alkylaryl group.

7. The complex of claim 6, wherein the alkyl portion of the alkylaryl group has 1-6 carbons.

8. The complex of claim 1, wherein $R^4$ is an alkyl having 1-6 carbons.

9. A composition comprising at least one complex having the formula:

$MY_nZ$ where:

n is 1, 2, or 3;

M is a metal in a +2, +3, or +4 oxidation state;

Y is the same or different at each occurrence and is selected from the group consisting of 8-hydroxyquinolate and a substituted 8-hydroxyquinolate; and Z has the formula I or II:

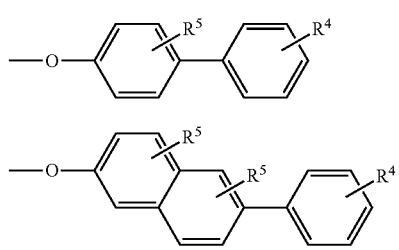

wherein $R^4$ and $R^5$ are independently selected and each is one or more of a substituent selected from the group consisting of H, alkyl, substituted aklyl, aryl, substituted aryl, F, CN, a solvent-solubilizing group, and a Tg enhancing group; and wherein at least one Y is a substituted 8-hydroxyquinolate having the formula

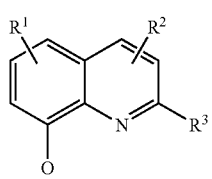

where:

$R^1$ and $R^2$ are the same or different at each occurrence and each represents one or more of a substituent selected from the group consisting of H, alkyl, fluoroalkyl, aryl, fluoroaryl, alkylaryl, alkoxy, aryloxy, fluoroalkoxy, fluoroaryloxy, heteroalkyl, fluoroheteroalkyl, heteroaryl, fluoroheteroaryl, heteroalkylaryl, heteroalkoxy, heteroaryloxy, fluoroheteroalkoxy, fluoroheteroaryloxy, cyano, dialkylamino, diarylamine, halide, wherein at least one of $R^1$ and $R^2$ is selected from the group consisting of an aryl group having 6-20 carbons and a heteroaryl having 4-20 carbons; and $R^3$ is selected from the group consisting of H, an alkyl group, and a substituted alkyl group.

10. The composition of claim 9, wherein M is selected from the group consisting of Al, Zn, Zr, In and Ga.

11. The composition of claim 10, wherein one of $R^1$ and $R^2$ is an alkyl group.

12. The composition of claim 9, further comprising at least one organic solvent.

13. The composition of claim 12, wherein the solvent is selected from the group consisting of benzene, alkyl substituted benzene, fluoroalkyl substituted benzene, alkoxy substituted benzene, halo substituted benzene, haloalkanes, alkyl or aryl esters, and alkyl or aryl ketones.

14. The composition of claim 13, wherein the solvent is selected from the group consisting of toluene, trifluorotoluene, chlorobenzene, anisole, ethylacetate, and cyclopentanone.

15. The composition of claim 9, further comprising a charge transport material.

16. The composition of claim 15, wherein the charge transport material is selected from the group consisting of triarylamines, triarylmethanes, and N-substituted carbazoles.

17. The composition of claim 15, further comprising a photoactive material.

18. The composition of claim 17, wherein the photoactive material is an organometallic complex.

19. An electronic device comprising an active layer comprising an organometallic complex having the formula:

$MY_nZ$ where:
- n is 1, 2, or 3;
- M is a metal in a +2, +3, or +4 oxidation state;
- Y is the same or different at each occurrence and is selected from the group consisting of 8-hydroxyquinolate and a substituted 8-hydroxyquinolate; and
- Z has the formula I or II:

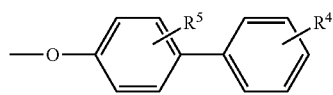
(I)

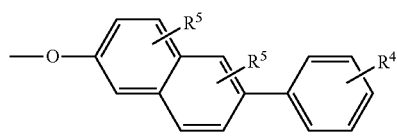
(II)

wherein $R^4$ and $R^5$ are independently selected and each is one or more of a substituent selected from the group consisting of H, alkyl, substituted alkyl, aryl, substituted aryl, F, CN, a solvent-solubilizing group, and a Tg enhancing group; and wherein at least one Y is a substituted 8-hydroxyquinolate having the formula

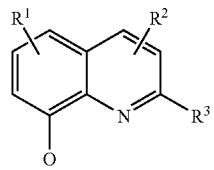

where:
- $R^1$ and $R^2$ are the same or different at each occurrence and each represents one or more of a substituent selected from the group consisting of H, alkyl, fluoroalkyl, aryl, fluoroaryl, alkylaryl, alkoxy, aryloxy, fluoroalkoxy, fluoroaryloxy, heteroalkyl, fluoroheteroalkyl, heteroaryl, fluoroheteroaryl, heteroalkylaryl, heteroalkoxy, heteroaryloxy, fluoroheteroalkoxy, fluoroheteroaryloxy, cyano, dialkylamine, diarylamine, halide, wherein at least one of $R^1$ and $R^2$ is selected from the group consisting of an aryl group having 6-20 carbons and a heteroaryl group having 4-20 carbons; and
- $R^3$ is selected from the group consisting of H, an alkyl group, and a substituted alkyl group.

20. The electronic device of claim 19, wherein the active layer is a photoactive layer.

21. The electronic device of claim 19, wherein the active layer is an electron transport layer.

* * * * *